United States Patent [19]

Arai

[11] 4,307,356

[45] Dec. 22, 1981

[54] SURFACE ACOUSTIC WAVE DEVICE

[75] Inventor: Seiichi Arai, Muko, Japan

[73] Assignee: Murata Manufacturing Co., Inc., Japan

[21] Appl. No.: 165,390

[22] Filed: Jul. 3, 1980

[30] Foreign Application Priority Data

Jul. 9, 1979 [JP] Japan .................................. 54/86794

[51] Int. Cl.[3] ........................ H03H 9/25; H03H 9/42; H03H 9/64

[52] U.S. Cl. ................................ 333/194; 310/313 D; 333/154; 333/195

[58] Field of Search ................................ 333/150-155, 333/193-196; 310/313 R, 313 A, 313 B, 313 C, 313 D, 365-366; 331/107 A; 358/188, 905

[56] References Cited

U.S. PATENT DOCUMENTS 3,596,211 7/1971 Dias et al. ................... 310/313 B X 4,060,833 11/1977 Onyshkevych ..................... 358/188

*Primary Examiner*—Marvin L. Nussbaum

*Attorney, Agent, or Firm*—Ostrolenk, Faber, Gerb & Soffen

[57] ABSTRACT

A surface acoustic wave device includes a piezoelectric substrate and a transmitting, a receiving and a reflecting transducer disposed thereon in a row along a predetermined path. The transmitting transducer is responsive to an input signal having a predetermined center frequency for propagating a first surface acoustic wave along the predetermined path. The receiving transducer is located at a location spaced a predetermined distance from the transmitting transducer and is adapted to convert the first acoustic wave to an electrical output signal, but also generates an undesired reflected wave. The reflecting transducer is provided close to one of the other two above-described transducers and is responsive to the first surface acoustic wave to generate a cancellation reflected wave which cancels the undesired reflected wave.

22 Claims, 13 Drawing Figures

SURFACE ACOUSTIC WAVE DEVICE

BACKGROUND OF THE INVENTION

The present invention relates to a surface acoustic wave device for use in a communication system, for example as a filter, and more particularly, to an electrode arrangement of the surface acoustic wave device which makes it possible to reduce or eliminate unwanted reflected waves, such as triple transit echo waves, without increasing the insertion loss.

Generally, a surface acoustic wave (SAW) device comprises a transmitting, or launching, transducer and a receiving transducer, which are formed from comb-like multi-electrode elements with their teeth interdigitated and disposed on a piezoelectric substrate. When an alternating electrical potential is applied to the electrodes of the transmitting transducer, an alternating electric field is generated that causes localized vibration in the substrate material. The vibrations give rise to acoustic waves, which propagate along the surface of the substrate in a defined path orthogonal to the electrodes, and may be detected at any point along the path by the receiving transducer.

At the receiving transducer, part of the acoustic wave energy is converted to electrical energy and delivered to the load, part of the acoustic wave energy is transmitted past the receiving transducer, and part of the acoustic wave energy is reflected back along the original path towards the transmitting transducer. This reflected surface wave, which is identical in frequency to the original surface wave but smaller in magnitude, is again similarly reflected at the transmitting transducer back along the same path towards the receiving transducer. The surface acoustic wave which has been so reflected twice and which has traveled three times between the transducers is generally called triple transit echo (TTE) wave. Since the TTE wave tends to interfere and distort the main, desired signal, adversely affecting the performance of the SAW device, it should preferably be eliminated. The interference and distortion by the TTE wave may become more considerable when each transducer is coupled with a tuning coil which is normally provided to minimize the insertion loss of the SAW device.

To solve this problem, there have been proposed various methods. One method is shown in FIG. 1, and includes the use of first, second and third transducers 1, 2 and 3 on a rectangular piezoelectric substrate 6. The first transducer 1 has a width, as measured in a direction transverse to the direction of wave propagation, equal to or larger than the combined widths of the second and third transducers 2 and 3, and is located at one end portion of the substrate 6. The transducers 2 and 3, which have identical size and configuration to each other, are located at the other end portion of the substrate 6 in side-by-side relation to each other, and are mutually offset in a direction orthogonal to the direction of surface acoustic wave propagation. Accordingly, the propagation of acoustic surface waves between the longitudinal the transducers 1 and 2 and the propagation of acoustic waves between the transducers 1 and 3 are carried out through different paths 4 and 5, respectively. The distance $L_{12}$ between centers of the first and second transducers 1 and 2 differs from the distance $L_{13}$ between the longitudinal centers of the first and third transducers 1 and 3 by an odd multiple of one-fourth of the wavelength $\lambda o$ of the acoustic surface waves at the center frequency of the device. When the transducer 1 is actuated to transmit surface acoustic waves along the paths 4 and 5, part of the surface acoustic wave arriving at the transducer 2 is converted to an electric signal, part is transmitted past through the transducer 2 and part is reflected along the original path towards the transducer 1. Similarly, part of the surface acoustic waves arriving at the transducer 3 is reflected back along the original path. Since there is a difference between distances $L_{12}$ and $L_{13}$, the acoustic surface wave reflected from the transducer 2 has a phase opposite to that reflected from the transducer 3. Therefore, the two reflected waves with opposite phase will cancel each other during their travel back to the transducer 1. This cancellation of the reflected waves can be effectively carried out even when the tuning coil is coupled to each transducer.

Although the arrangement of FIG. 1 effectively eliminates the undesirable reflected surface wave to prevent any TTE waves from being transmitted to the receiving transducer 2, it is necessary to provide two parallel paths 4 and 5. Thus, the conventional SAW device described above requires a relatively large substrate 6, resulting in high manufacturing cost.

Another method is disclosed in Japanese Utility Model application laid open publication No. 4647/1979 of ONISHI et al. in which a multistrip coupler is employed between transducers, e.g., between transducer 1 and transducers 2 and 3 of the device shown in FIG. 1. According to this arrangement, it is possible to reduce the size of the transmitting transducer 1 to a size similar to those of the transducers 2 and 3. However, this arrangement also has a considerably large size of substrate since the transducers are arranged at positions mutually offset in a direction orthogonal to the direction of acoustic surface wave propagation.

A further method is disclosed in U.S. Pat. No. 3,596,211 to Dias et al. wherein three transducers aligned in a row are used. The center transducer and one side transducer are respectively provided for transmitting and receiving the surface acoustic waves, or vice versa, while the remaining transducer on the other side is provided for producing a reflected surface wave. According to this prior art, the surface waves reflected at opposite side transducers are directed towards the center transducer in which the received reflected waves are converted to electrical signal. Since the distance between the center transducer and one side transducer and the distance between the center transducer and the other side transducers are prearranged relative to the wavelength, the electrical signal created by the reflected signal from one side transducer has a polarity opposite to the electrical signal created by the reflected signal from the other side transducer, resulting in cancellation of the two reflected waves. Therefore, according to this prior art, the cancellation is carried out in the center transducer.

SUMMARY OF THE INVENTION

It is a primary object of the present invention to provide a compact SAW device which can eliminate the undesired TTE waves.

It is another object of the present invention to provide a SAW device of the above described type which can also minimize the insertion loss.

It is a further object of the present invention to provide a SAW device of the above described type which is simple in construction and can readily be manufactured at low cost.

In accomplishing these and other objects, a SAW device according to the present invention comprises a layer or substrate of piezoelectric material and three transducers coupled to the piezoelectric layer. A first, or transmitting, transducer is coupled to the piezoelectric layer at a first location and is responsive to an input signal of a predetermined center frequency for propagating a first acoustic surface wave along a predetermined path in the piezoelectric layer. A second, or receiving, transducer is coupled to the piezoelectric layer at a second location on the predetermined path and spaced a predetermined distance from the first location. The receiving transducer is adapted to convert the first acoustic surface wave to a desired electrical output signal but also initiates an undesired reflected wave. A third, or reflecting, transducer is coupled to the piezoelectric layer on the predetermined path and close to one of the first and second locations and is responsive to the first surface acoustic wave generated by the transmitting transducer. The reflecting transducer is adapted to initiate a cancellation reflected wave which propagates along the predetermined path. The cancellation reflected wave is substantially in counterphase with the undesired reflected wave, whereby the undesired reflected wave is canceled by the cancellation reflected wave during their travel along the predetermined path.

BRIEF DESCRIPTION OF THE FIGURES

These and other objects and features of the present invention will become apparent from the following description taken in conjunction with preferred embodiments thereof with reference to the accompanying drawings, throughout which like parts are designated by like reference numerals, and in which.

DETAILED DESCRIPTION OF THE PREFERRED EMBODIMENTS

Figure 1:
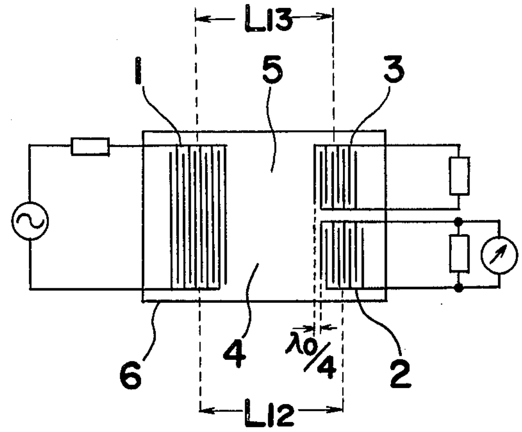
FIG. 1 is a diagrammatic view of a SAW device according to the prior art.
Figure 2:
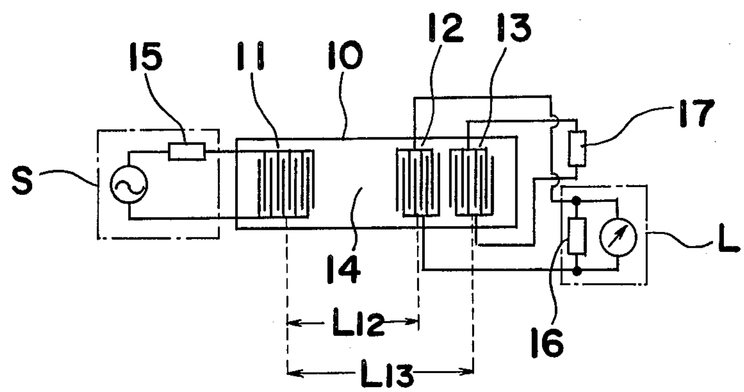
FIG. 2 is a diagrammatic view of a SAW device according to one embodiment of the present invention.

Referring to FIG. 2, a surface acoustic wave (SAW) device according to one embodiment of the present invention comprises an elongated rectangular substrate 10 constituted by a solid plate of piezoelectric material, such as PZT, or $LiNbO_3$ or by a thin layer of ZnO laminated over one flat surface of a base. The rectangular substrate 10 has three transducers 11, 12 and 13 formed over the piezoelectric material in alignment with each other. Of the three transducers 11, 12 and 13, two neighboring transducers, e.g., transducers 12 and 13, should preferably be located closely adjacent to each other. Each of the transducers 11, 12 and 13 includes a pair of thin-film metal electrodes, such as aluminum electrodes provided by any known method, such as, deposition or photo-etching, and arranged in the shape of combs with interdigitated teeth. According to a preferred embodiment, the electrode arrangement of the transducer 12 is identical in size and configuration to that of the closely adjacent transducer 13. In the embodiment shown in FIG. 2, the transducer 11 is coupled with a signal source S to make the transducer 11 a transmitting transducer. Similarly, in FIG. 2, the transducer 12 is coupled with a load L to make the transducer 12 a receiving transducer, and the transducer 13 is coupled with a suitable impedance circuit 17 to make the transducer 13 a reflecting transducer. Element 15 represents an output impedance component of the signal source S and element 16 represents an input impedance component of the load L. Each of the impedance components 15 and 16 includes an inductive component and a resistive component and may further include a capacitive component. The impedance circuit 17 includes an inductor and a resistor which are selected to match its impedance value equal with that of the impedance component 16. The impedance circuit 17 may further include a capacitor.

The distance $L_{12}$ between the centers of the transducers 11 and 12 and the distance $L_{13}$ between the centers of the transducers 11 and 13 are so selected that the difference $|L_{12}-L_{13}|$ therebetween is equal to an odd multiple of one-fourth of the wavelength $\lambda o$ of the acoustic surface waves at the center frequency fo of the signal responsive to the SAW device. This relation can be expressed as follows:

$$|L_{12} - L_{13}| = \left(\frac{N}{2} + \frac{1}{4}\right) \lambda o \qquad \text{(Equation 1)}$$

in which N is any integer, including zero.

When an alternating electrical signal is applied to the electrodes of transmitting transducer 11 from the signal source S, the transducer 11 generates acoustic waves, which propagate in opposite directions along the surface of the substrate in a path 14 orthogonal to the teeth of the electrodes. The surface waves propagated along the substrate 10 to the left in FIG. 2 terminate at the end of the substrate 10 where a suitable acoustic wave absorber (not shown) is provided to minimize or eliminate the arriving surface waves. On the other hand, the surface waves propagated along the path 14 of the substrate 10 to the right in FIG. 2 are partly received by the transducer 12, partly reflected by the transducer 12 back towards the transmitting transducer 11 and partly transmitted past the transducer 12 towards the reflecting transducer 13. Since the surface wave reflected at the transducer 12 gives rise to the unwanted TTE wave, this reflected wave is hereinafter referred to as an undesired reflected wave.

Of the surface waves which have passed through the transducer 12, some surface waves are similarly reflected by the transducer 13 back towards the transducer 12. Since the surface waves reflected at the transducer 13 serve to cancel the undesired reflected wave in a manner described below, these reflected waves are hereinafter referred to as cancellation reflected waves.

Because the transducers 12 and 13 have identical size and configuration, and because the impedance circuit 17 has approximately the same impedance value as that of the impedance component 16, the reflection coefficients of the transducers 12 and 13 are approximately equal to each other. In other words, the undesired reflected wave and the cancellation reflected wave have, when the attenuation of the wave magnitude during their travel is negligibly small, approximately the same magnitude. Furthermore, because the difference $|L_{12}-L_{13}|$ is equal to an odd multiple of one-fourth of wavelength $\lambda o$, the cancellation reflected wave has 180° phase difference with respect to the undesired reflected wave when they appear in the path 14. Therefore, during their travel along the path 14 towards the transmitting transducer 11, these two reflected waves cancel each other.

In the above arrangement, since the cancellation reflected wave travels along the same path 14 which is used for travelling the original, or wanted, surface wave, the SAW device according to the present invention can be prepared compact in size and has an advantageous effect in elimination of undesired TTE wave. Furthermore, since an inductive component is included in each of the impedance components 15 and 16, the insertion loss can be reduced.

In theory, the cancellation reflected wave and the undesired reflected wave must be equal in magnitude and phase in order to carry out the desired wave cancellation. From this point of view, the difference $|L_{12}-L_{13}|$ should be exactly equal to an odd multiple of one-fourth of wavelength $\lambda o$, and there should be no attenuation of magnitude of the cancellation reflected wave during its travel between the transducers 12 and 13 and through the transducer 12. From a practical standpoint, however, the actual difference $|L_{12}-L_{13}|$ may be deviated from the desired value, i.e., the odd multiple of one-fourth of wavelength $\lambda o$, while magnitude of the cancellation reflected wave may be attenuated more or less during its travel particularly when it passes through the transducer 12.

When such deviation and/or attenuation take place to a more than negligible degree, they should be corrected. The correction can be carried out by the use of the impedance circuit 17 in a manner described below.

When the difference $|L_{12}-L_{13}|$ deviates from its desired value, the reactance value in the impedance circuit 17 is adjusted to control the phase of the cancellation reflected wave.

Figure 3:
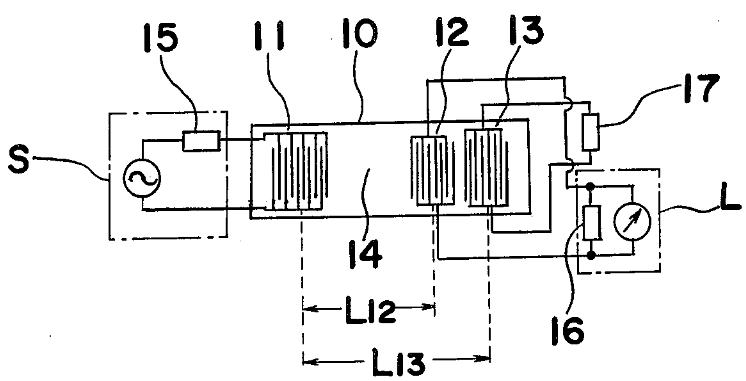
FIG. 3 is a view similar to FIG. 2, but particularly shows a modification thereof.

On the other hand, when the magnitude of the cancellation reflected wave is attenuated during its travel, it can be corrected by adjusting the resistance value in the impedance circuit 17 to make the magnitude of the cancellation reflected wave approximately equal to that of the undesired reflected wave. Instead of adjusting the resistance value, the magnitude of the cancellation reflected wave can be controlled by the change of length of the interdigitated teeth. For example, the width of the reflecting transducer 13, as measured in a direction transverse to the direction of wave propagation, can be made greater than that of the receiving transducer 12, as shown in FIG. 3. In this case, a greater fraction of the energy of the surface acoustic waves will be reflected from the reflecting transducer 13 than from the receiving transducer 12. Thus, the cancellation reflected wave will have approximately the same amplitude as the amplitude of the undesired reflected wave when they travel along the path 14.

Before the description of the other embodiments according to the present invention proceeds, a relation between the difference $|L_{12}-L_{13}|$ and a phase difference between the cancellation and undesired reflected waves will be described.

When the difference $|L_{12}-L_{13}|$ has a value as given by the above equation (1), and when the reflection coefficients at the transducers 12 and 13 are the same, the phase difference $\Delta\phi$ between the cancellation reflected wave and the undesired reflected wave can be expressed as follows:

$$\Delta\phi = \frac{(2N+1)\lambda o}{\lambda} \cdot \pi \qquad \text{(Equation 2)}$$

in which $\lambda$ is the wavelength of the acoustic wave propagated along the path 14. When the acoustic wave propagated along the path 14 has a wavelength equal to $\lambda o$, the equation (2) can be expressed as follows:

$$\Delta\phi = 2N\pi + \pi \qquad (3)$$

The equation (3) indicates that the cancellation reflected wave and undesired reflected wave have phases opposite to each other. However, when the frequency $\lambda$ deviates from the central frequency $\lambda o$, the phase difference $\Delta\phi$ will deviate from $\pi$ to cause the cancellation effect to deteriorate. The deterioration will become more considerable as the number N increases. Accordingly, in order to provide the cancellation effect over a wide frequency range of the acoustic waves, it is preferable to make the number N as small as possible. The decrease of the number N can be achieved by the decrease of the distance $|L_{12}-L_{13}|$ between the centers of the transducers 12 and 13. For this purpose, according to the present invention, the electrode array in each of the receiving and reflecting transducers is divided into a plurality of sections, and the sections of receiving transducer and the sections of reflecting transducer are alternately disposed one after another along the substrate. (This embodiment is described below with reference to FIG. 6.) Or, the electrode teeth in each transducer are provided in spaced-apart groups to define at least two sections of electrode array with a space formed therebetween. In this case, the one section of one transducer, e.g. the receiving transducer is interposed in the space of the other, e.g. the reflecting transducer. The manners in which the teeth are disposed, and the sections are interposed are described below in connection with FIGS. 4*a* and 4*b*, and the characteristic resulting from such discontinuous electrode array is described below in connection with FIG. 5.

Figure 4A:
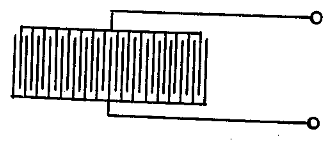
FIGS. 4*a* and 4*b* are top plan views of interdigitated electrodes before and after predetermined sections thereof are removed as one step in one procedure to manufacturing a SAW device according to the invention.
Figure 4B:
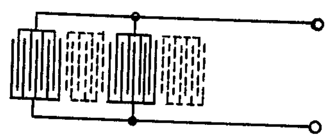
Figure 5:
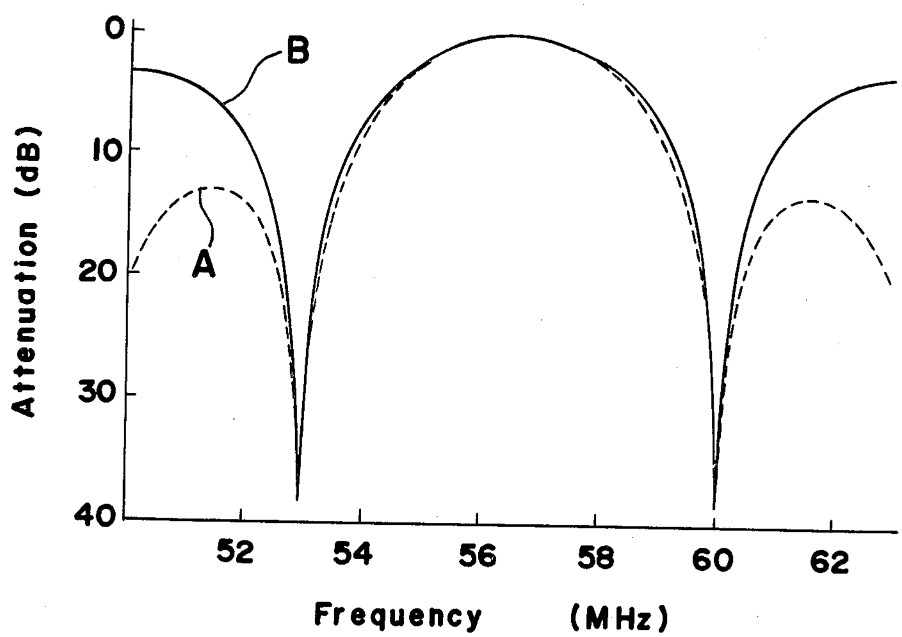
FIG. 5 is a graph showing the frequency characteristic of SAW devices employing the interdigitated electrodes of FIGS. 4*a* and 4*b*.

FIGS. 4*a* and 4*b* show electrode arrays before and after the teeth are skipped or removed in groups. In FIG. 4*b*, the teeth which are skipped or removed are shown by a dotted line. The attenuation characteristic relative to the frequency, obtained when the electrode array of FIG. 4*a* is used in the transducer, is shown by dotted line A in a graph of FIG. 5, while the characteristic obtained when the electrode array of FIG. 4*b* is used, is shown by solid line B in the same graph. As is apparent from the graph, the transducer employing the electrode array with skipped or grouped teeth exhibits a characteristic which is fairly similar to that obtained from the transducer employing the fully aligned electrode array in the main response region, i.e., 53 to 60 MHz in the graph of FIG. 5, for instance.

On the contrary, in the regions above and below the main region, which are referred to as spurious regions, the curve B obtained by the use of electrode array of skipped teeth deviates from the curve A obtained by the use of fully aligned electrode array. This deviation of the curve B from the curve A implies the presence of an unwanted spurious mode. However, since such spurious mode can be suppressed to a practically negligible level in the associated transducer, i.e. the transmitting transducer, no serious problem arises from the discontinuous arrangement of the electrode array.

In the following embodiments, each of the transducers 12 and 13 is divided into a plurality of sections to interpose the section of one transducer between the sections of the other transducer.

Figure 6:
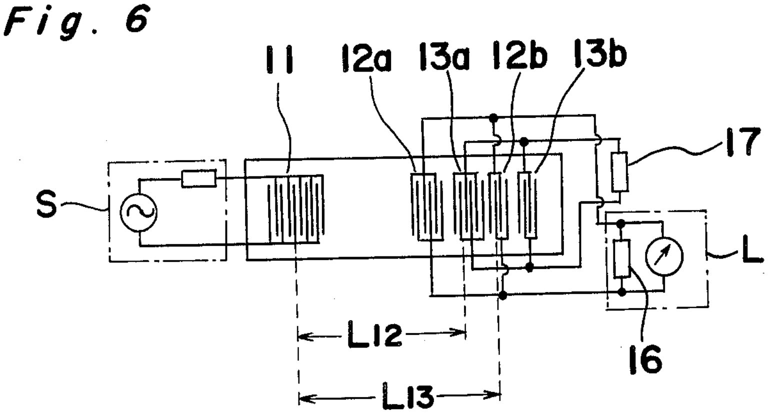
FIG. 6 is a diagrammatic view of a SAW device according to a second embodiment of the present invention.

Referring to FIG. 6, there is shown a SAW device according to a second embodiment of the present invention. In FIG. 6, reference numerals **12*a* and 12*b* designate first and second sections of a receiving transducer and reference numerals 13*a* and 13*b* designate first and second sections of a reflecting transducer. The first sections 12*a* and 13*a* of the receiving and reflecting transducers have identical size and configuration to each other, and the second sections 12*b* and 13*b* also have the identical size and configuration to each other. The first and second sections in each transducer 12, 13 are so spaced from each other that the phase of the acoustic wave in the first section of each corresponds to that in the second section, and are so disposed on the substrate 10 that the first section 13*a* of the reflecting transducer is interposed between the first and second sections 12*a* and 12*b* of the receiving transducer, while the second section 12*b* of the receiving transducer is interposed between the first and second sections 13*a* and 13*b* of the reflecting transducer. The distance between the centers of the first sections 12*a* and 13*a*, and the distance between the centers of the second sections 12*b* and 13*b* are both equal to odd multiples of one-fourth of wavelength λo. Accordingly, the distance between the centers of the receiving transducer and the reflecting transducer is equal to an odd multiple of one-fourth of wavelength λo. The first and second sections 12*a* and 12*b* of the receiving transducer are connected in parallel with each other and are connected to the load L. The first and second sections 13*a* and 13*b* of the reflecting transducer are also connected in parallel with each other and are connected to the impedance circuit 17**.

When the sections of the transducers are interposed with each other in the manner described above, it is possible to make the difference $|L_{12}-L_{13}|$ smaller than that obtained with the arrangement of the first embodiment. Therefore, the phase difference $\Delta\phi$ can be set approximately equal to $\pi$ over a wide range of frequencies to improve the cancellation effect.

As described in connection with the first embodiment, the difference $|L_{12}-L_{13}|$ is not necessarily equal to an odd multiple of quarter of wavelength λo but can deviate therefrom, since it is possible to control the phase of the cancellation reflected wave by controlling the impedance in the impedance circuit 17. Furthermore, the sections of the reflecting transducer can be arranged greater in size than the receiving transducer in a manner similar to that described above in connection with FIG. 3.

Figure 7:
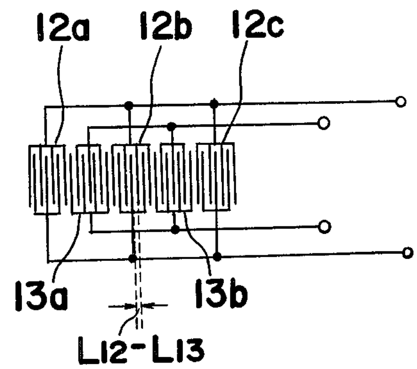
FIG. 7 is a top plan view of an interdigitated electrode arrangement for use in a SAW device of a third embodiment of the present invention.

Referring to FIG. 7, there is shown an arrangement of the receiving and reflecting transducers according to a third embodiment of the present invention. In this embodiment, the number of sections in one of the receiving and reflecting transducers 12, 13 is greater by one than the number of sections contained in the other transducer 13 or 12. In other words, if the number of sections in the receiving transducer 12 is $N_{12}$, the number $N_{13}$ of sections in the reflecting transducer 13 can be expressed as follows:

$$N_{13}=N_{12}\pm 1 \quad (4)$$

In the example shown in FIG. 7, the receiving transducer is divided into three sections **12*a*, 12*b* and 12*c* while the reflecting transducer is divided into two sections 13*a* and 13*b*. These sections are disposed in such a manner that the section 13*a* of the reflecting transducer is interposed between the sections 12*a* and 12*b* of the receiving transducer and the section 13*b* of the reflecting transducer is interposed between the sections 12*b* and 12*c*** of the receiving transducer. According to a preferred embodiment, sections in one transducer are all identical in size and configuration with each other and are disposed symmetrically about a center line of the respective transducer extending perpendicularly to the direction of wave propagation. In this arrangement, the difference $|L_{12}-L_{13}|$, as measured between their center lines, can be made as small as one-fourth of wavelength λ. Therefore, the number N in the equation (2) can be set to zero to provide a phase difference $\Delta\phi$ equal to $(\lambda o/\lambda)\pi$. Thus, the cancellation of the undesired reflected wave can be effected over a wide range of frequency.

Figure 8:
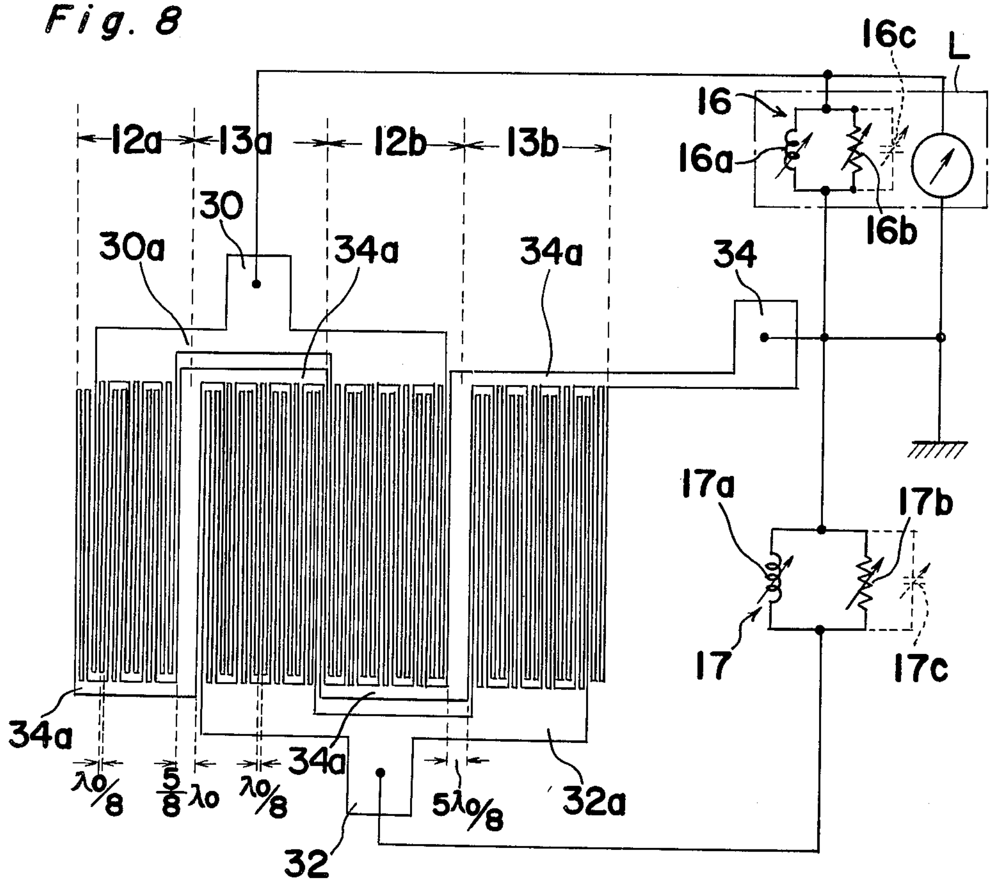
FIG. 8 is a schematic view of an interdigitated electrode arrangement for use in a SAW device of a fourth embodiment of the present invention.

Referring to FIG. 8, there is shown an electrode arrangement of a SAW device according to a fourth embodiment of the present invention. The receiving and reflecting transducers in this embodiment are formed by three separate patterns of electrodes, which are first and second electrodes 30 and 32, and a ground, or common, electrode 34. The receiving transducer is constituted by the first electrode 30 in combination with the ground electrode 34, and the reflecting transducer is constituted by the second electrode 32 in combination with the ground electrode 34. The first electrode 30 includes an elongated base portion **30*a* and a plurality of electrode teeth portions extending parallel to each other in the same direction from the base portion 30*a*, each tooth portion having a width of λo/8. The electrode teeth portions are provided in pairs, such that the two electrode teeth portions in a pair are located closely adjacent to each other with a spacing of λo/8 therebetween. Each two neighboring pairs are spaced 5λo/8 from each other to allow interposition of a similar electrode teeth portion pair of the ground electrode 34. These electrode teeth portions in pairs are generally called split electrodes. The teeth of the first electrode 30 are divided into two groups: the first group located at the first end portion of the base portion 30*a*** in FIG. 8; and the second group located at the right end portion of the base portion 30*a*. The first and second groups are spaced a predetermined distance from each other to allow electrode teeth groups of the reflecting transducer to be disposed therebetween.

The second electrode 32 includes an elongated base portion 32*a* and a plurality of split electrode teeth arranged in a manner similar to those of the first electrode 30. The electrode teeth in the second electrode 32 are also divided into two groups, the first group being located between the first and second groups of the first electrode 30, and the second group being located on the right side of the second group of the first electrode 30 in FIG. 8.

The ground electrode 34 includes a base portion 34*a* of generally zig-zag shape and a plurality of split electrode teeth extending from the base portion 34*a*. The split electrodes of the ground electrode teeth 34 are interleaved in the split electrodes of the first and second electrode teeth 30 and 32.

In FIG. 8, reference numerals 12*a* and 12*b* designate two sections which constitute the receiving transducer, and reference numerals 13*a* and 13*b* designate two sections which constitute the reflecting transducer. It is to be noted that the distance between the centers of the receiving transducer and the reflecting transducer is set equal to an odd multiple of one-fourth of wavelength λo. For this purpose, a part of the base portion 34*a* which is located between the first groups of the first and second electrodes 30 and 32, and another part of the base portion 34*a* which is located between the second groups of the first and second electrodes 30 and 32, each have a width equal to 5λo/8.

The electrical connection to the three electrodes 30, 32 and 34 is such that the load L is connected between the electrodes 30 and 34, and the impedance circuit 17 comprising a variable inductor 17*a* and a variable resistor 17*b* is connected between the electrodes 32 and 34. Elements 16*a*, 16*b* represent inductive and resistive components of the input impedance component of the load L. In addition to above, the impedance circuit 17 may further include a variable capacitor 17*c*, and the impedance component 16 may be assumed to have a capacitive component 16*c*, as shown by a dotted line.

It is to be noted that the inductor 17*a* and capacitor 17*c* in the impedance circuit 17 can be so controlled, when the distance between the centers of the receiving and reflecting transducers is not equal to an odd multiple of one-fourth of wavelength λo, as to set the phase of the cancellation reflected wave opposite to that of the undesired reflected wave. Furthermore, the resistor 17*b* in the circuit 17 can be so controlled as to set the magnitude of the cancellation reflected wave equal to that of the undesired reflected wave.

Figure 10:
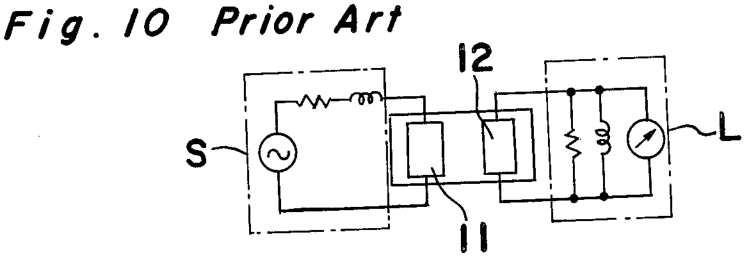
FIGS. 10 and 11 are diagrammatic views showing, respectively conventional SAW device and a SAW device according to the present invention used to obtain the characteristics depicted in the graph of FIG. 9.
Figure 11:
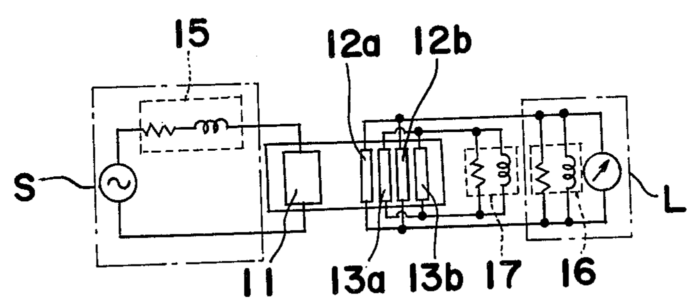
Figure 9:
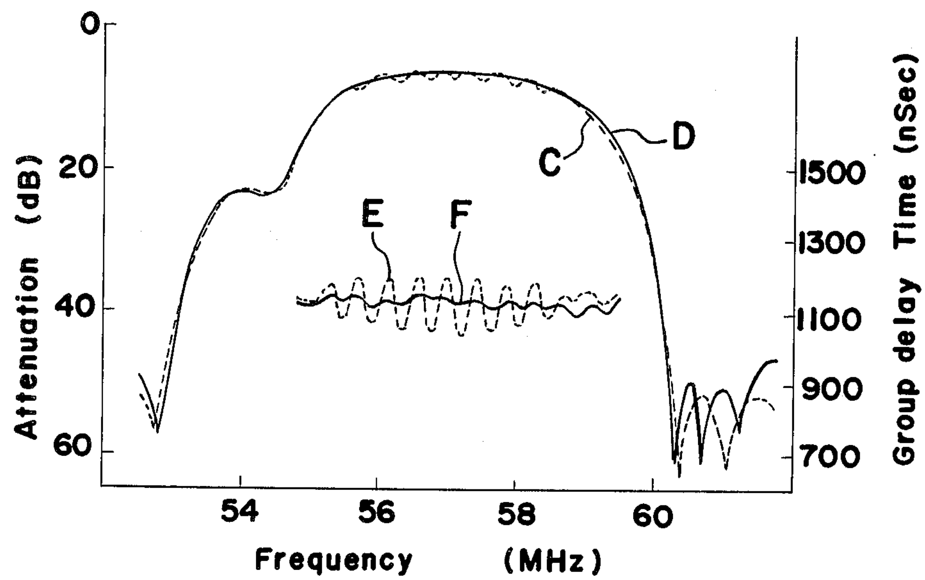
FIG. 9 is a graph showing characteristic obtained from the SAW device of the present invention and that obtained from the conventional SAW device.

Since center portion and right-hand end portion of the receiving transducer of FIG. 8 are spaced apart in a manner described above with reference to FIGS. 4*a* and 4*b*, and since the sections of the reflecting transducer are interposed in the spaces of the receiving transducer, the receiving and reflecting transducers of FIG. 8 together occupy about the same area as the area necessary to accommodate the receiving transducer of the conventional SAW device. Therefore, the SAW device according to the present invention can be a size approximately equal to the size of SAW devices of conventional types, and yet have the advantage of cancellation of the undesired reflected waves. Next, the comparison of the characteristics of the SAW devices of the present invention and of the conventional type is described. The SAW devices used for the comparison are of a type having a single propagation path, and are diagrammatically shown in FIGS. 10 and 11. The SAW device of conventional type as shown in FIG. 10 has a transmitting transducer 11 and a receiving transducer 12. The SAW device of the present invention as shown in FIG. 11 has a transmitting transducer 11, a receiving transducer 12*a* and 12*b*, and a reflecting transducer 13*a* and 13*b*, which are arranged in the manner shown in FIG. 8. The transducers in both conventional and present invention SAW devices include a impedance component, in which the output resistive component of the transmitting transducer is about 75Ω which the input resistive component of the receiving and reflecting transducers is about 1.2 kΩ. The characteristics obtained from the SAW devices are depicted in a graph of FIG. 9, in which the abscissa represents frequency, and the ordinate represents attenuation for curves C and represents D and group delay time for curves E and F. In the graph, the curves C and E exhibit characteristics of the conventional SAW device and the curves D and F exhibit characteristics of the SAW device of the present invention.

As apparent from the graph, although the attenuation characteristic curve C obtained by the conventional SAW device shows insertion loss as low as about 6.5 dB, there are undesirable ripples appearing in the pass band. On the contrary, the attenuation characteristic curve D obtained by the SAW device of the present invention shows substantially no ripples in the pass band. When the group delay time characteristic is taken into consideration, the curve E obtained by the conventional SAW device shows more considerable ripples than those in the curve F obtained by the SAW device of the present invention. These ripples can be considered as being caused by the presence of TTE waves. Since there are almost no ripples appearing in the curves D and F, it is understood that the undesired reflected waves which originate the TTE waves are kept to a negligible level in the SAW device of the present invention.

Although, in the embodiments described above, the reflecting transducer is provided on the side of the receiving transducer remote from the transmitting transducer, it is possible to provide the reflecting transducer on the side of the receiving transducer closer to the transmitting transducer. In other words, the distance $L_{13}$, which has been shown in the drawings to be greater than the distance $L_{12}$, can be smaller than the distance $L_{12}$.

Figure 12:
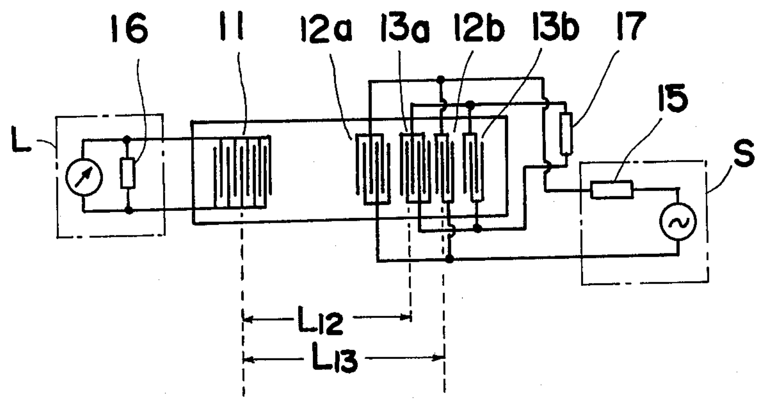
FIG. 12 is a view similar to FIG. 6, but particularly showing a modification thereof.

Furthermore, although, in the above described embodiments, the transducer positioned adjacent to the reflecting transducer is described as being used as a receiving transducer, it is possible to connect said transducer as a transmitting transducer. In this case, the transducer located remote from the reflecting transducer serves as a receiving transducer. For example, in the embodiment shown in FIG. 6, if the external electrical circuit connected to the transducer 11 and that connected to the transducer sections 12*a* and 12*b* are exchanged, the transducer 11 serves as a receiving transducer while the transducer sections 12*a* and 12*b* serve as a transmitting transducer, as shown in FIG. 12. The cancellation of the undesired reflected wave can also be carried out by this arrangement.

It is to be noted that the reflecting transducer can be further provided closely adjacent the transducer 11 so as to improve the cancellation effect of the undesired reflected wave.

Although the present invention has been fully described with reference to several preferred embodiments, many modifications and variations thereof will be apparent to those skilled in the art, and the scope of the present invention is therefore to be limited not by the details of the preferred embodiments described above, but only by the terms of appended claims.

What is claimed is:

1. A surface acoustic wave device, comprising:

a substrate of piezoelectric material; said substrate being adapted to propagate an acoustic surface wave having a predetermined center frequency along a first predetermined path therein;

a transmitting transducer disposed on said piezoelectric substrate at a first location for generating a first acoustic surface wave and causing it to propagate along said predetermined path in said piezoelectric substrate responsive to an input signal applied thereto;

a receiving transducer disposed on said piezoelectric substrate at a second location on said predetermined path and spaced from said first location by a predetermined distance, said receiving transducer being adapted to convert said first acoustic surface wave to an electrical output signal and also to generate an undesired reflected wave; and a reflecting transducer disposed on said piezoelectric substrate at a third location that is on said predetermined path and that is close to one of said first and second locations, said reflecting transducer being adapted to generate, responsive to said first surface acoustic wave generated by the transmitting transducer, a cancellation reflected wave which propagates along said predetermined path substantially in counterphase with said undesired reflected wave, whereby said undesired reflected wave is cancelled by said cancellation reflected wave; said transmitting, receiving and reflecting transducers being disposed in a row along said predetermined path.

2. A surface acoustic wave device as claimed in claim 1, wherein said reflecting transducer is located close to said second location, and wherein said receiving and reflecting transducers each have a center as measured along said predetermined path, the distance between said center of said receiving and reflecting transducers being substantially equal to an odd multiple of one-fourth of a wavelength of a vibration of said predetermined center frequency in said piezoelectric material.

3. A surface acoustic wave device as claimed in claim 2, wherein said receiving and reflecting transducers have identical size and configuration.

4. A surface acoustic wave device as claimed in claim 2, further comprising an impedance circuit electrically connected to said reflecting transducer and an output circuit electrically connected to said receiving transducer for receiving said electrical output signal, said impedance circuit having an impedance substantially equal to that of said output circuit.

5. A surface acoustic wave device as claimed in claim 1, wherein said reflecting transducer is located close to said first location, and wherein said transmitting and reflecting transducers each have a center as measured along said predetermined path, the distance between said centers of said transmitting and reflecting transducers being substantially equal to an odd multiple of one-fourth of a wavelength of a vibration of said predetermined center frequency in said piezoelectric material.

6. A surface acoustic wave device, comprising:

a substrate of piezoelectric material; said substrate being adapted to propagate an acoustic surface wave having a predetermined center frequency along a first predetermined path therein;

a transmitting transducer disposed on said piezoelectric substrate at a first location for generating a first acoustic surface wave and causing it to propagate along said predetermined path in said piezoelectric substrate responsive to an input signal applied thereto; said transmitting transducer having a center as measured along said predetermined path;

a receiving transducer disposed on said piezoelectric substrate at a second location on said predetermined path and having a plurality of sections, said sections of said receiving transducer being aligned with each other along said path, each consecutive two of said sections of said receiving transducer being spaced a first predetermined distance from each other as measured along said predetermined path, said receiving transducer having a center as measured along said predetermined path and said center of said receiving transducer being spaced from said center of said transmitting transducer by a second predetermined distance as measured along said predetermined path; said receiving transducer being adapted to convert said first acoustic surface wave to an electrical output signal and also to generate an undesired reflected wave; and a reflecting transducer disposed on said piezoelectric substrate at said second location on said predetermined path and having a plurality of sections, said sections of said reflecting transducer being interleaved with said sections of said receiving transducer in such a manner that said sections of said receiving and reflecting transducers are alternately aligned along said path; said reflecting transducer having a center as measured along said predetermined path and said center of said reflecting transducer being spaced from said center of said transmitting transducer by a third predetermined distance as measured along said predetermined path, said third distance being different from said second predetermined distance, said reflecting transducer being responsive to said first surface acoustic wave generated by the transmitting transducer to generate a cancellation reflected wave which propagates along said predetermined path substantially in counterphase with said undesired reflected wave, whereby said undesired reflected wave is cancelled by said cancellation reflected wave.

7. A surface acoustic wave device as claimed in claim 6, wherein said receiving and reflecting transducers have identical size and configuration.

8. A surface acoustic wave device as claimed in claim 6, further comprising an impedance circuit coupled to said reflecting transducer and an output circuit which is coupled to said receiving transducer for receiving said electrical output signal, said impedance circuit having an impedance substantially equal to that of said output circuit.

9. A surface acoustic wave device as claimed in claim 6, wherein said second and third predetermined distances are different by an odd multiple of one-fourth of a wavelength of a vibration of said predetermined center frequency in said piezoelectric material.

10. A surface acoustic wave device as claimed in claim 6, wherein the number of said sections of said receiving transducer is equal to the number of said sections of said reflecting transducer.

11. A surface acoustic wave device as claimed in claim 6, wherein the number of said sections of said receiving transducer is greater by one than the number of said sections of said reflecting transducer.

12. A surface acoustic wave device as claimed in claim 6, wherein each of said receiving and reflecting transducers comprises a pair of comb shaped electrodes with interdigitated electrode teeth.

13. A surface acoustic wave device as claimed in claim 6, wherein each of said receiving and reflecting transducers comprises a pair of comb shaped electrodes with interdigitated electrode teeth.

14. A surface acoustic wave device as claimed in claim 13, wherein each of said electrode teeth is bifurcated to provide a pair of electrode teeth portions.

15. A surface acoustic wave device as claimed in claim 14, wherein each of said electrode teeth portions has a width equal to one-eighth of a wavelength of a vibration of said predetermined center frequency in said piezoelectric material.

16. A surface acoustic wave device (SAW), comprising:

- a substrate of piezoelectric material; said substrate being adapted to propagate an acoustic surface wave having a predetermined center frequency along a first predetermined path therein;
- a transmitting transducer disposed on said piezoelectric substrate at a first location for generating a first acoustic surface wave and causing it to propagate along said predetermined path in said piezoelectric substrate responsive to an input signal applied thereto, said transmitting transducer having a plurality of sections which are aligned with each other along said path, each consecutive two of said sections of said transmitting transducer being spaced a first predetermined distance from each other;
- a receiving transducer disposed on said piezoelectric substrate at a second location on said predetermined path, said receiving transducer and said transmitting transducer each having a respective center as measured along said path, said center of said receiving transducer being spaced from said center of said transmitting transducer by a second predetermined distance; said receiving transducer being adapted to convert said first acoustic surface wave to an electrical output signal and also to generate an undesired reflected wave responsive to said first acoustic surface wave; and
- a reflecting transducer disposed on said piezoelectric substrate at said first location on said predetermined path and having a plurality of sections, said sections of said reflecting transducer being interleaved with said sections of the transmitting transducer in such a manner that said sections of said transmitting and reflecting transducers are alternately aligned along said path; said reflecting transducer having a center as measured along said predetermined path, and said center of said reflecting transducer being spaced from said center of said receiving transducer by a third predetermined distance which is different from said second predetermined distance; said reflecting transducer being adapted to generate, responsive to said first surface acoustic wave generated by said transmitting transducer, a cancellation reflected wave which propagates along said predetermined path substantially in counterphase with said undesired reflected wave, whereby said undesired reflected wave is cancelled by said cancellation reflected wave.

17. A surface acoustic wave device as claimed in claim 16, wherein said transmitting and reflecting transducers have identical size and configuration.

18. A surface acoustic wave device as claimed in claim 16, further comprising an impedance circuit coupled to said reflecting transducer and an output circuit which is coupled to said receiving transducer for providing said electrical output signal, said impedance circuit having an impedance substantially equal to that of said output circuit.

19. A surface acoustic wave device as claimed in claim 16, wherein said second and third predetermined distances are different by an odd multiple of one-fourth of a wavelength of a vibration of said predetermined center frequency in said piezoelectric material.

20. A surface acoustic wave device as claimed in claim 16, wherein the number of said sections of said transmitting transducer is equal to the number of said sections of said reflecting transducer.

21. A surface acoustic wave device as claimed in claim 16, wherein the number of said sections of said transmitting transducer is greater by one than the number of said sections of said reflecting transducer.

22. A surface acoustic wave device as claimed in claim 16, wherein the number of said sections of said transmitting transducer is less by one than the number of said sections of said reflecting transducer.

* * * * *